US007851698B2

(12) United States Patent
De Ceuster et al.

(10) Patent No.: US 7,851,698 B2
(45) Date of Patent: *Dec. 14, 2010

(54) TRENCH PROCESS AND STRUCTURE FOR BACKSIDE CONTACT SOLAR CELLS WITH POLYSILICON DOPED REGIONS

(75) Inventors: Denis De Ceuster, Woodside, CA (US); Peter John Cousins, Menlo Park, CA (US); David D. Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/392,923

(22) Filed: Feb. 25, 2009

(65) Prior Publication Data

US 2009/0308438 A1 Dec. 17, 2009

Related U.S. Application Data

(60) Provisional application No. 61/060,921, filed on Jun. 12, 2008.

(51) Int. Cl.
*H01L 31/00* (2006.01)
*H01L 21/00* (2006.01)

(52) U.S. Cl. ............... 136/255; 136/256; 136/261; 438/57; 257/E31.032

(58) Field of Classification Search ........... 136/255, 136/261, 256
See application file for complete search history.

(56) References Cited

U.S. PATENT DOCUMENTS

| | | | |
|---|---|---|---|
| 3,961,997 A | 6/1976 | Chu | |
| 4,144,096 A | 3/1979 | Wada et al. | |
| 4,927,770 A | 5/1990 | Swanson | |
| 4,989,059 A * | 1/1991 | Micheels et al. | ............ 257/446 |
| 5,030,295 A | 7/1991 | Swanson et al. | |
| 5,053,083 A | 10/1991 | Sinton | |
| 5,057,439 A | 10/1991 | Swanson et al. | |
| 5,164,019 A | 11/1992 | Sinton | |
| 5,360,990 A | 11/1994 | Swanson | |
| 5,369,291 A | 11/1994 | Swanson | |
| 5,549,762 A * | 8/1996 | Cantarini | .................. 136/249 |
| 5,641,362 A | 6/1997 | Meier | |
| 5,665,175 A * | 9/1997 | Safir | ..................... 136/255 |

(Continued)

OTHER PUBLICATIONS

W.P. Mulligan, et al., "A Flat-Plate Concentrator: Micro-Concentrator Design Overview", 2000, 3 sheets, Proceedings of the 28th IEEE PVSC.

(Continued)

*Primary Examiner*—Jeffrey T Barton
*Assistant Examiner*—Allison Bourke
(74) *Attorney, Agent, or Firm*—Okamoto & Benedicto LLP

(57) ABSTRACT

A solar cell includes polysilicon P-type and N-type doped regions on a backside of a substrate, such as a silicon wafer. An interrupted trench structure separates the P-type doped region from the N-type doped region in some locations but allows the P-type doped region and the N-type doped region to touch in other locations. Each of the P-type and N-type doped regions may be formed over a thin dielectric layer. Among other advantages, the resulting solar cell structure allows for increased efficiency while having a relatively low reverse breakdown voltage.

12 Claims, 16 Drawing Sheets

U.S. PATENT DOCUMENTS

| | | | |
|---|---|---|---|
| 5,777,346 | A | 7/1998 | Temple |
| 6,084,175 | A | 7/2000 | Perry et al. |
| 6,211,455 | B1 | 4/2001 | Ford et al. |
| 6,274,402 | B1 | 8/2001 | Verlinden et al. |
| 6,313,395 | B1 | 11/2001 | Crane et al. |
| 6,333,457 | B1 | 12/2001 | Mulligan et al. |
| 6,337,283 | B1 | 1/2002 | Verlinden et al. |
| 6,387,726 | B1 | 5/2002 | Verlinden et al. |
| 6,423,568 | B1 * | 7/2002 | Verlinden et al. ............. 438/98 |
| 6,707,046 | B2 | 3/2004 | Possin et al. |
| 6,933,504 | B2 | 8/2005 | Hoffman et al. |
| 6,998,288 | B1 | 2/2006 | Smith et al. |
| 7,054,408 | B2 | 5/2006 | Jiang et al. |
| 7,112,465 | B2 | 9/2006 | Goushcha et al. |
| 7,135,350 | B1 | 11/2006 | Smith et al. |
| 7,468,485 | B1 | 12/2008 | Swanson |
| 2003/0106580 | A1 * | 6/2003 | Lizotte ....................... 136/258 |
| 2005/0145274 | A1 * | 7/2005 | Polce et al. ................. 136/244 |
| 2005/0167603 | A1 | 8/2005 | Hoffman |
| 2007/0215203 | A1 | 9/2007 | Ishikawa et al. |
| 2008/0067622 | A1 | 3/2008 | Bui et al. |
| 2008/0128846 | A1 | 6/2008 | Bui et al. |

OTHER PUBLICATIONS

K. R. McIntosh, et al., "The Choice of Silicon Wafer for the Production of Low-Cost Rear-Contact Solar Cells", May 2003, 4 sheets, Sunpower Corporation, Sunnyvale, CA.

P.J. Verlinden, et al., "Will We have a 20%-Efficient(PTC) Photovoltaic System?", 2001, 6 sheets, Proceedings of the 17th Europe Photovoltaic Solar Energy Conference.

William P. Mulligan, et al., "Development of Chip-Size Silicon Solar Cells", 2000, 6 sheets, Proceedings of the 28th IEEE PVSC.

Akira Terao, et al., "A Mirror-Less Design for Micro-Concentrator Modules", 2000, 4 sheets, Proceedings of the 28th IEEE PVSC.

P.J. Verlinden, et al., "Backside-Contact Silicon Solar Cells with Improved Efficiency for the '96 World Solar Challenge", 1997, 5 sheets, Proceedings of the 15th EPSEC.

P.J. Verlinden, et al., "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson "The Promise of Concentrators", 2000, Prog. Photovolt. Res. Appl. 8, pp. 93-111, Sunpower Corporation.

Ronald A. Sinton, et al., "Simplified Backside-Contact Solar Cells", Feb. 1990, pp. 348-352, IEEE Transactions on Electron Devices, vol. 37. No. 2.

PCT International Search Report for Application No. PCT/US2009/042135, 2 sheets, Jun. 19, 2009.

* cited by examiner

US 7,851,698 B2

TRENCH PROCESS AND STRUCTURE FOR BACKSIDE CONTACT SOLAR CELLS WITH POLYSILICON DOPED REGIONS

REFERENCE TO RELATED APPLICATION

This application claims the benefit of U.S. Provisional Application No. 61/060,921, filed on Jun. 12, 2008.

STATEMENT REGARDING FEDERALLY SPONSORED RESEARCH OR DEVELOPMENT

The invention described herein was made with Governmental support under contract number DE-FC36-07G017043 awarded by the United States Department of Energy. The Government may have certain rights in the invention.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. A solar cell includes P-type and N-type doped regions. Solar radiation impinging on the solar cell creates electrons and holes that migrate to the doped regions. In a backside contact solar cell, both the doped regions and the interdigitated metal contact fingers coupled to them are on the backside of the solar cell. The contact fingers allow an external electrical circuit to be coupled to and be powered by the solar cell.

Efficiency is an important characteristic of a solar cell as it is directly related to the solar cell's capability to generate power. Accordingly, techniques for increasing the efficiency of solar cells are generally desirable. The present invention allows for increased solar cell efficiency by providing processes for fabricating novel solar cell structures.

SUMMARY

In one embodiment, a solar cell includes polysilicon P-type and N-type doped regions on a backside of a substrate, such as a silicon wafer. An interrupted trench structure separates the P-type doped region from the N-type doped region in some locations but allows the P-type doped region and the N-type doped region to touch in other locations. Each of the P-type and N-type doped regions may be formed over a thin dielectric layer. Among other advantages, the resulting solar cell structure allows for increased efficiency while having a relatively low reverse breakdown voltage.

These and other features of the present invention will be readily apparent to persons of ordinary skill in the art upon reading the entirety of this disclosure, which includes the accompanying drawings and claims.

The use of the same reference label in different figures indicates the same or like components. The figures are not drawn to scale.

DETAILED DESCRIPTION

In the present disclosure, numerous specific details are provided, such as examples of materials, process parameters, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In solar cells with P-type and N-type doped regions in the substrate, the P-type and N-type doped regions may be formed with separate or abutting perimeters. However, this is not true with polysilicon doped regions because recombination in the space charge region where the polysilicon doped regions touch is very high due to the lifetime of charge carriers in the polysilicon being very low. That is, the touching polysilicon doped regions adversely affect efficiency. Embodiments of the present invention address this problem associated with polysilicon doped regions and formed doped regions in general.

Figure 1:
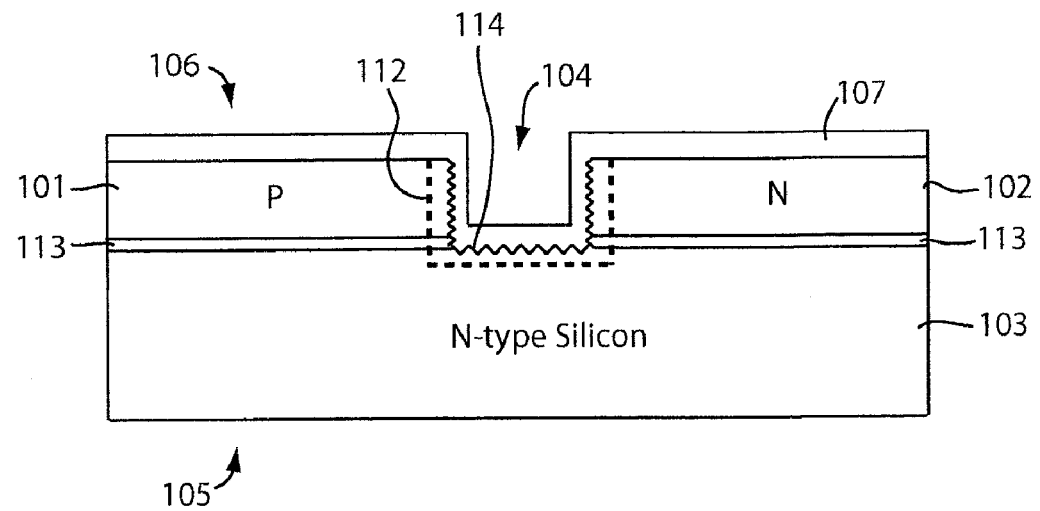
FIGS. 1 and 2 show solar cell structures in accordance with an embodiment of the present invention.

FIG. 1 schematically shows a sectional view of a solar cell structure in accordance with an embodiment of the present invention. In the example of FIG. 1, the solar cell is a backside contact solar cell in that its doped regions 101 and 102 are on the backside 106 opposite to the front side 105. The front side 105 faces the sun during normal operation. The doped regions 101 and 102 are formed on a thin dielectric layer 113. The dielectric layer 113 may be formed to a thickness of 5 Angstroms to 40 Angstroms. In one embodiment, the dielectric layer 113 comprises silicon dioxide thermally grown on the surface of the substrate 103 to a thickness of 20 Angstroms. The dielectric layer 113 may also comprise silicon nitride. The dielectric layer 113 advantageously allows for surface passivation. The polysilicon of the doped regions 101 and 102 applies an electric field across the dielectric layer 113, which repels minority carriers and accumulates majority carriers at the dielectric interface.

In the example of FIG. 1, the doped region 101 is a P-type doped region, while the doped region 102 is an N-type doped region. A substrate 103 comprises an N-type silicon wafer in this example. As can be appreciated, the substrate 103 may also comprise a P-type silicon or other wafer with appropriate changes to the rest of the structure. There are several P-type and N-type doped regions in any given solar cell but only one of each is shown in FIG. 1 for clarity of illustration.

The doped regions 101 and 102 may comprise doped polysilicon formed to a thickness of about 2000 Angstroms by low pressure chemical vapor deposition (LPCVD). The doped region 101 may comprise polysilicon doped with a P-type dopant (e.g., boron) and the doped region 102 may comprise polysilicon doped with an N-type dopant (e.g., phosphorus). The polysilicon may be deposited over the thin dielectric layer 113 and then doped by diffusion. The polysilicon may also be pre-doped prior to deposition on the dielectric layer 113. Polysilicon is the preferred material for the doped regions 101 and 102 for its compatibility with high temperature processing, allowing for increased thermal budget.

As shown in FIG. 1, the doped regions 101 and 102 are separated by a trench 104, which serves as a gap between the doped regions 101 and 102.

The trench 104 may be formed by laser trenching or conventional etching, for example. In one embodiment, the trench 104 is about 100 microns wide. The trench 104 may be formed before or after a diffusion step that dopes the polysilicon doped regions 101 and 102. If the trench 104 is formed before the diffusion step, the passivation region 112 may comprise an N-type passivation region formed during the diffusion step.

In one embodiment, the trench 104 is formed using a process that not only forms the trench 104 but also forms a randomly textured surface 114 on the surface of the trench 104. The randomly textured surface 114 improves solar radiation collection of light incident on the back of the solar cell, i.e. a bifacial configuration. A wet etch process comprising potassium hydroxide and isopropyl alcohol may be used to form the trench 104 and to texture the surface 114 with random pyramids. The trench 104 may be formed to dig 1 to 10 microns (e.g., 3 microns) into the substrate 103.

A dielectric in the form of a silicon nitride 107 is deposited in the trench 104. The silicon nitride 107 preferably has a relatively large positive fixed charge density to place the silicon surface under the trench 104 in accumulation and to provide good surface passivation. The positive fixed charge density of the silicon nitride 107 may naturally occur as part of the deposition process used to form the silicon nitride 107. In one embodiment, the silicon nitride 107 is formed to a thickness of about 400 Angstroms by plasma enhanced chemical vapor deposition (PECVD). The resulting accumulation layer repels minority carriers, i.e. positively charged holes in N-type material. The trench 104 also prevents the space charge region from developing in the polysilicon. Instead, the space charge develops in the single crystal silicon underneath the P-type polysilicon. In this region, lifetime is not reduced due to grain boundaries, and hence the parasitic recombination is suppressed. A portion of this space charge region also intersects the surface of the wafer in the trench 104. The positive charge in the silicon nitride 107 reduces the impact of this region of space charge region as well narrowing the region.

An example process flow for fabricating the solar cell structure of FIG. 1 may include forming a thin dielectric layer 113 over a backside surface of the substrate 103, forming an undoped polysilicon layer over the thin dielectric layer 113, doping the polysilicon layer into P-type and N-type doped regions 101 and 102, etching the doped polysilicon layer to form the trench 104 and the textured surface 114, forming the passivation region 112, and forming the silicon nitride 107 in the trench 104. Rather than diffusing dopants on an undoped polysilicon layer, the doped regions 101 and 102 may also be formed by depositing pre-doped polysilicon on the dielectric layer 113 using conventional deposition, masking, and etching techniques. The silicon nitride 107 preferably has a planar, as opposed to textured, surface. However, the planarity of the silicon nitride 107 is not critical and no additional planarization step is needed. For example, the planarity of the silicon nitride 107 may be as deposited. The trench 104 may be formed before or after doping of the doped regions 101 and 102.

Figure 2:
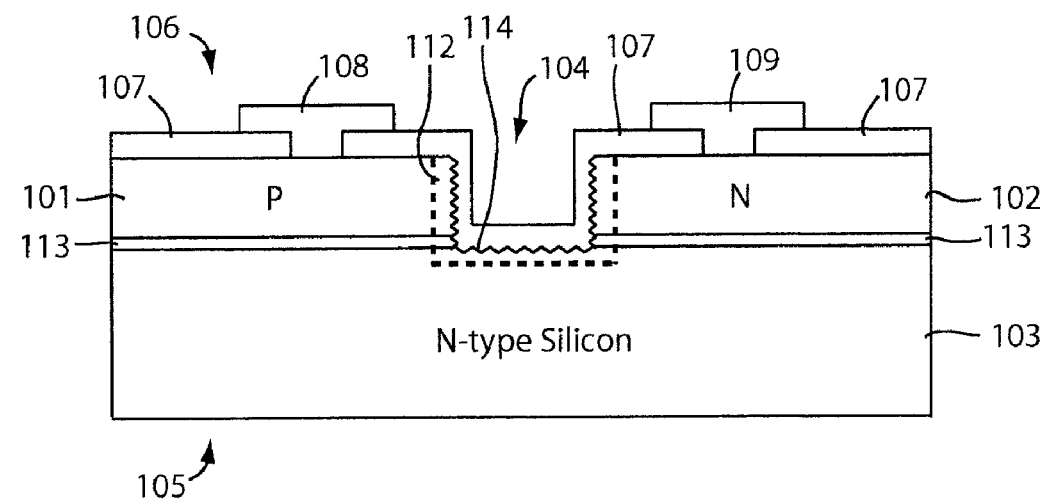

Referring to FIG. 2, interdigitated metal contact fingers 108 and 109 may be formed through the silicon nitride 107 to make an electrical connection to the doped regions 101 and 102, respectively. External electrical circuits may be attached to the interdigitated metal contact fingers 108 and 109 to connect to and be powered by the solar cell. In the example of FIG. 2, the metal contact finger 108 may be connected to a positive electrical terminal and the metal contact finger 109 may be connected to a negative electrical terminal.

The trench structure of FIG. 1 addresses the aforementioned issues relating to polysilicon parasitic space charge recombination several ways. Firstly, the trench 104 separates the doped regions 101 and 102 so they are not physically in contact. This prevents the space charge region from existing in either polysilicon film. Secondly, the resulting accumulation layer under the trench 104 repels minority carriers to improve surface passivation. Thirdly, the textured surface 114 in the trench 104 increases solar radiation collection. These advantageously help increase solar cell efficiency.

FIGS. 3-10 show sectional views illustrating the fabrication of a solar cell in accordance with an embodiment of the present invention. There are a plurality of P-type doped regions and N-type doped regions in a solar cell but only one of each is shown as being fabricated in the following example for clarity of illustration.

Figure 3:
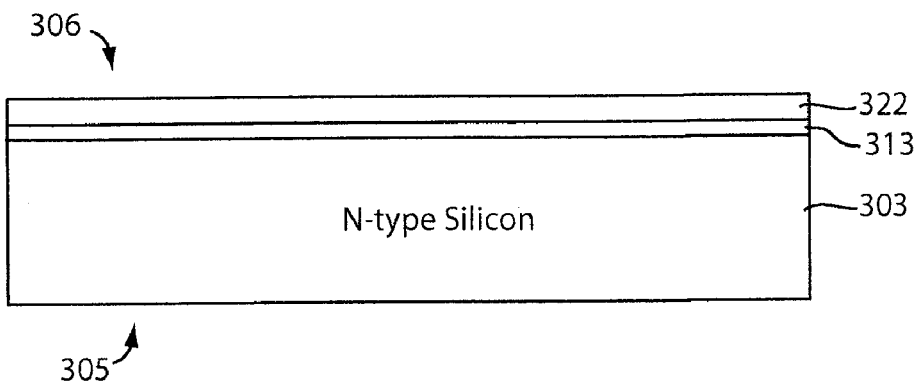
FIGS. 3, 4, 5, 6, 7A, 8A, 7B, 8B, 9 and 10 illustrate the fabrication of a solar cell in accordance with an embodiment of the present invention.
Figure 4:
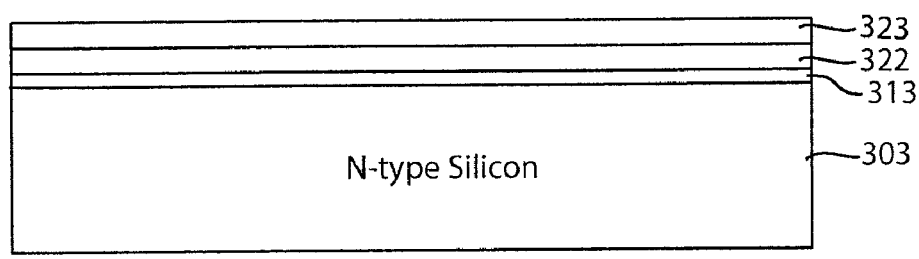
Figure 5:
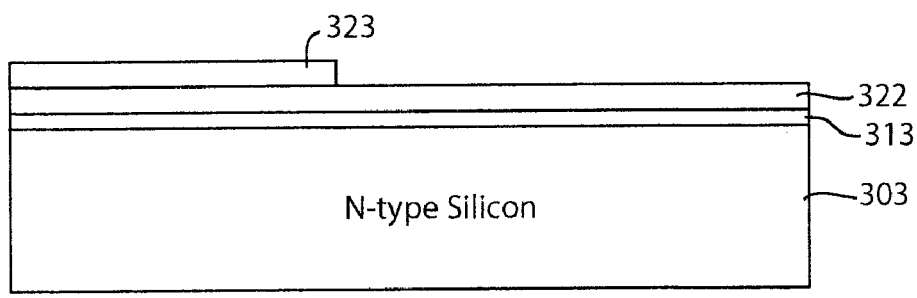

The embodiment of FIGS. 3-10 begins with formation of a thin dielectric layer 313 on a backside surface of a substrate 303 (FIG. 3). The substrate 303 may comprise an N-type silicon wafer, for example. The dielectric layer 313 may be formed to a thickness of 5 Angstroms to 40 Angstroms (e.g., 20 Angstroms). In one embodiment, the dielectric layer 313 comprises silicon dioxide thermally grown on the surface of the substrate 103. The dielectric layer 313 may also comprise silicon nitride, for example. An undoped polysilicon layer 322 is then formed on the dielectric layer 313. The polysilicon layer 322 may be formed to a thickness of about 2000 Angstroms by LPCVD, for example. A doped silicon dioxide layer 323 is then formed over the polysilicon layer 322 (FIG. 4). The silicon dioxide layer 323 serves as a dopant source for a subsequently formed doped region, which is a P-type doped region 301 in this example (see FIG. 7A or 8B). The silicon dioxide layer 323 may thus be doped with a P-type dopant, such as boron. The doped silicon dioxide layer 323 is patterned to remain over an area of the polysilicon layer 322 where the P-type doped region 301 is to be formed (FIG. 5). The silicon dioxide layer 323 may be formed to a thickness of about 1000 Angstroms by APCVD.

Figure 6:
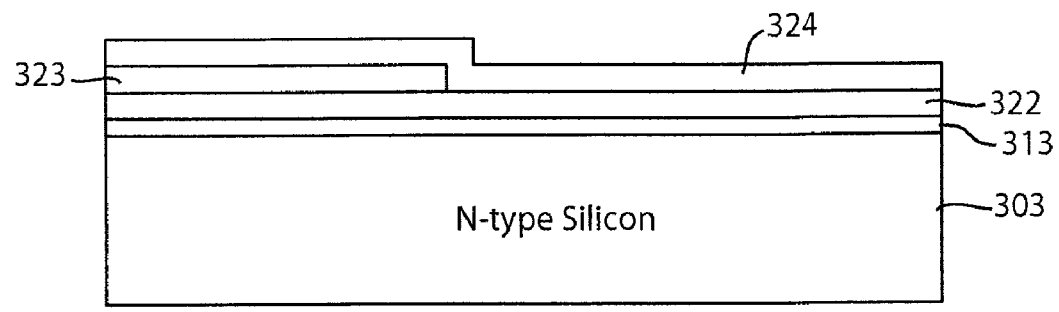

A doped silicon dioxide layer 324 is formed over the silicon dioxide 323 and the polysilicon layer 322 (FIG. 6). The silicon dioxide 324 serves as a dopant source for a subsequently formed doped region, which is an N-type doped region 302 in this example (see FIG. 7A or 8B). The silicon dioxide 324 may thus be doped with an N-type dopant, such as phosphorus. The silicon dioxide 324 may be formed to a thickness of about 2000 Angstroms by APCVD.

Figure 7A:
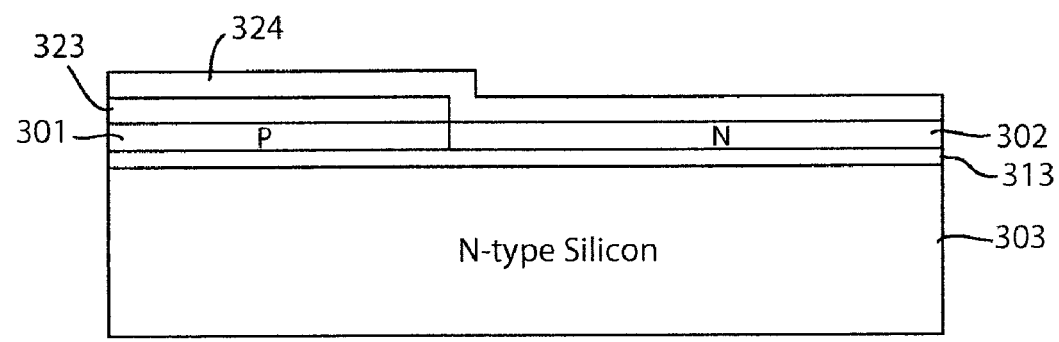
Figure 8A:
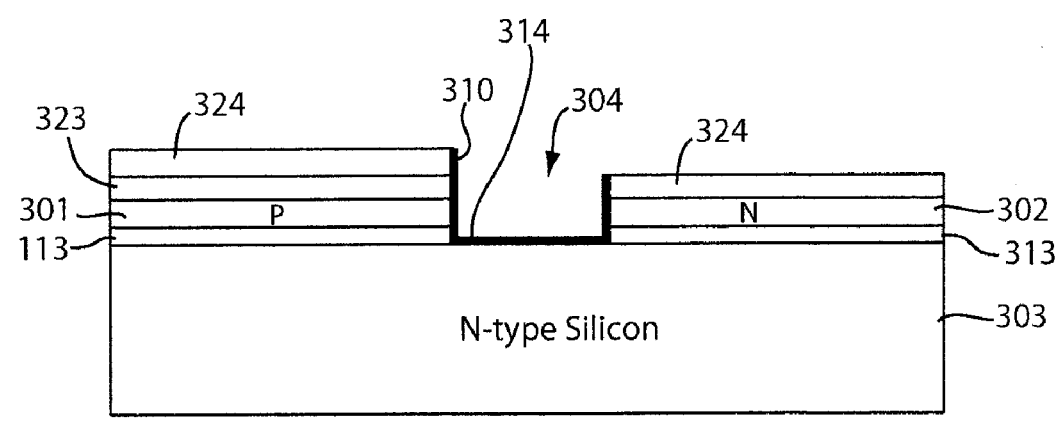
Figure 7B:
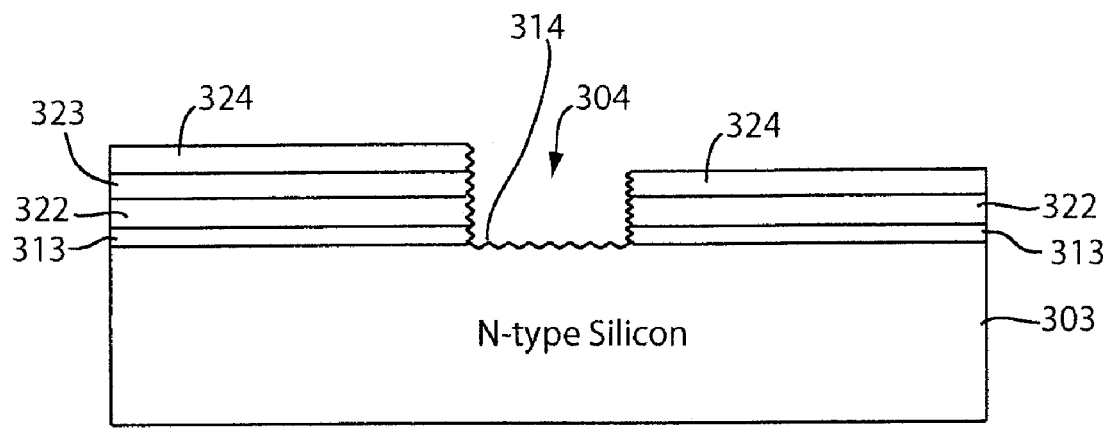
Figure 8B:
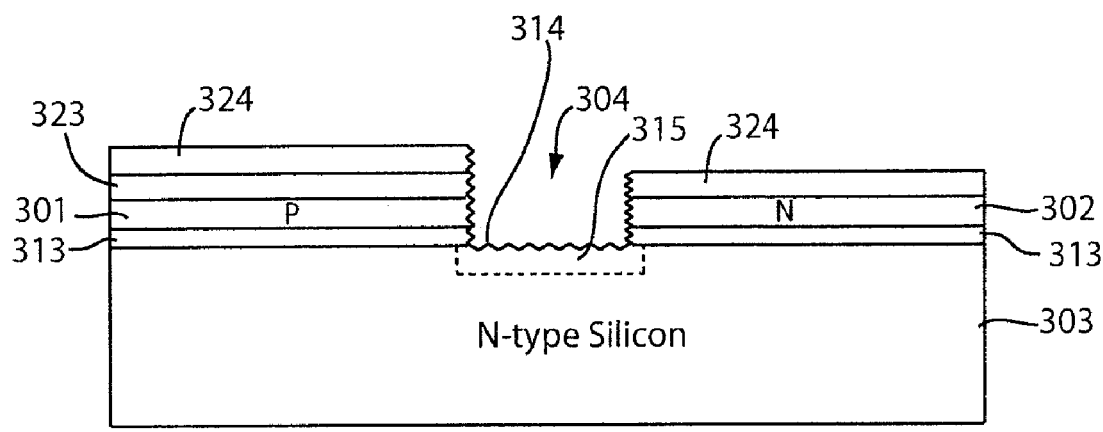

The trench separating the doped regions may be formed before formation of the doped regions in a first trench formation process or after formation of the doped regions in a second trench formation process. FIGS. 7A and 8A illustrate process steps for the first trench formation process, while FIGS. 7B and 8B illustrate process steps for the second trench formation process. Both trench formation processes may proceed from FIG. 6 and continue on to FIG. 9.

In the first trench formation process, a thermal drive-in step diffuses dopants from the silicon dioxides 323 and 324 to the underlying polysilicon layer 322, thereby forming P-type and N-type doped regions in the polysilicon layer 322, which is accordingly relabeled as P-type doped region 301 and N-type doped region 302 (FIG. 7A). The thermal drive-in step may be performed by heating the sample of FIG. 6. The preferred drive conditions give a heavily doped, e.g., greater than $1\ e^{20}$ $cm^{-3}$, polysilicon layer that is uniform throughout the thickness of the film and has very little doping under the polysilicon, e.g., equal to or less than $1\ e^{18}\ cm^{-3}$. The thermal drive-in step results in the polysilicon layer 322 under the silicon dioxide 323 forming the P-type doped region 301 and polysilicon layer 322 under the silicon dioxide 324 forming the N-type doped region 302.

The silicon dioxide 324, silicon dioxide 323, doped region 301, doped region 302, and thin dielectric layer 313 are etched to form a trench 304 (FIG. 8A). The trench etch may comprise a multi-step etch process, with the last etch step stopping on the substrate 303. The trench 304 may be about 100 microns wide, for example. However, there is no known limit to the minimum width as long as the P-type doped region 301 and N-type doped region 302 do not contact each other. The trench 304 may be formed by conventional etching processes including by laser trenching. In one embodiment, the trench 304 has a textured surface 314 for improved solar radiation collection efficiency. In one embodiment, a wet etch process comprising potassium hydroxide and isopropyl alcohol is used to form the trench 304 and to texture the surface 314 with random pyramids. The trench 304 may extend 1 to 10 microns, e.g., 3 microns, into the substrate 303.

A thin (less than 200 Angstroms, e.g., 100 Angstroms) passivation layer 310 may be formed on the surface 314 of the trench 304. The passivation layer 310 may comprise silicon dioxide thermally grown on the surface 314 or deposited silicon nitride layer, for example.

In the second trench formation process, the silicon dioxide 324, silicon dioxide 322, and thin dielectric layer 313 of the sample of FIG. 6 are etched to form the trench 304 (FIG. 7B). Textured surface 314 may be formed on the surface of the trench 304. The trench etch is essentially the same as in the first trench formation process except that the trench is formed before formation of the doped regions of the solar cell.

A thermal drive-in step is performed to diffuse dopants from the silicon dioxide layers 323 and 324 to the underlying polysilicon layer 322, thereby forming the doped regions 301 and 302 as in the first trench formation process (FIG. 8B). In this case, in the second trench formation process, a passivation region 315 is formed in the substrate 303 under the trench 304 during the diffusion process. The passivation region 315 may comprise diffused N-type dopants. In one embodiment, the passivation region 315 is formed by introducing POCl3 (phosphorus chloride oxide) in the diffusion furnace during the thermal drive-in. The passivation region 315 serves the same function as the passivation region 112 of FIG. 1.

In both the first and second trench formation processes, the trench 304 serves as a gap physically separating the P-type doped region 301 from the N-type doped region 302. The processing of the solar cell continues from either FIG. 8A or 8B to FIG. 9.

Figure 9:
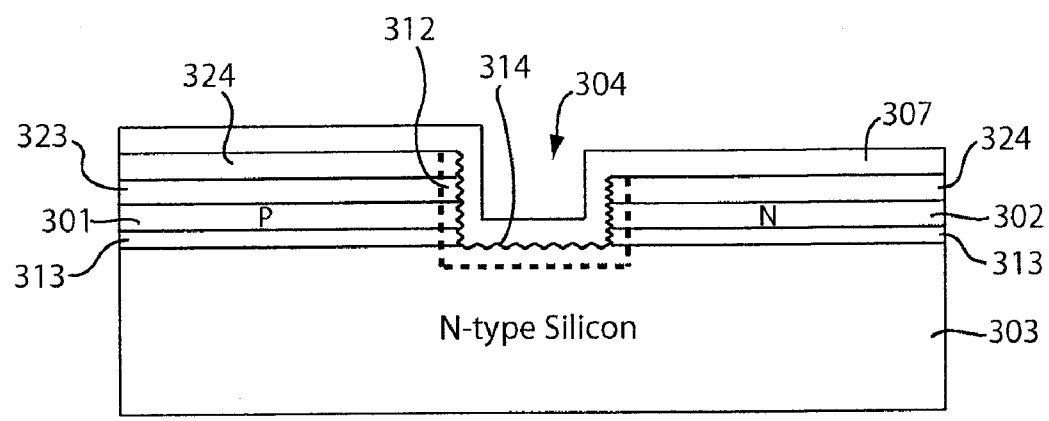
Figure 10:
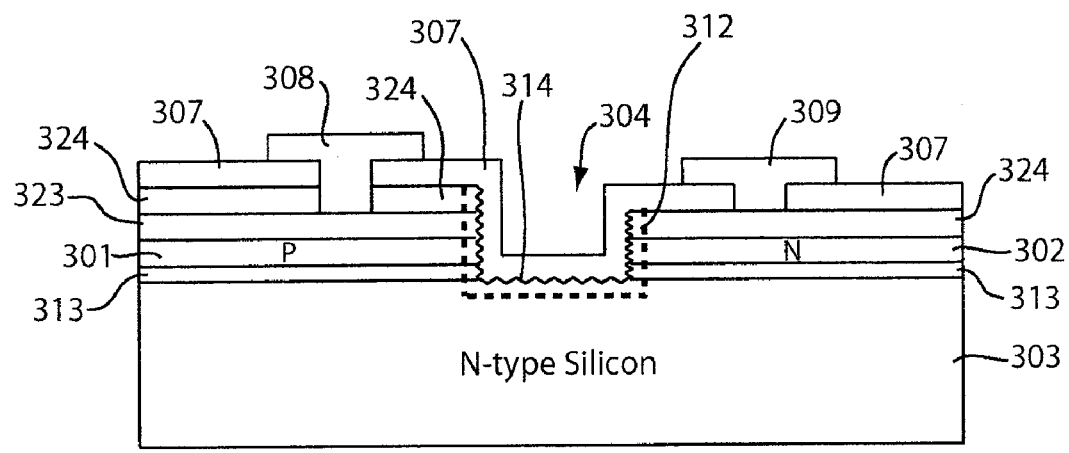

Continuing with FIG. 9, a dielectric in the form of a silicon nitride layer 307 is formed in the trench 304. In the example of FIG. 9, the silicon nitride layer 307 is also formed over the layers 323 and 324. The silicon nitride layer 307 preferably has a relatively large positive fixed charge density to place the silicon surface under the trench 304 in accumulation and to provide good surface passivation. The positive fixed charge density on the silicon nitride layer 307 may naturally occur as part of a PECVD process, for example. In one embodiment, the silicon nitride 307 is formed to a thickness of about 400 Angstroms by PECVD. The silicon nitride 307 preferably has a planar (e.g., as deposited) surface. In FIGS. 9 and 10, the passivation region 312 represents either the passivation layer 310 (see FIG. 8A) or the passivation region 315 (see FIG. 8B) depending on the trench formation process used.

Interdigitated metal contact fingers 308 and 309 may then be formed through the silicon nitride 307 to make an electrical connection to the doped regions 301 and 302 by way of layers 323 and 324, respectively (FIG. 10). External electrical circuits may be attached to the interdigitated metal contact fingers 308 and 309 to connect to and be powered by the solar cell. In the example of FIG. 10, the metal contact finger 308 may be coupled to a positive electrical terminal and the metal contact finger 309 may be coupled to a negative electrical terminal. The resulting solar cell provides the same benefits as the solar cell of FIG. 1.

Figure 11:
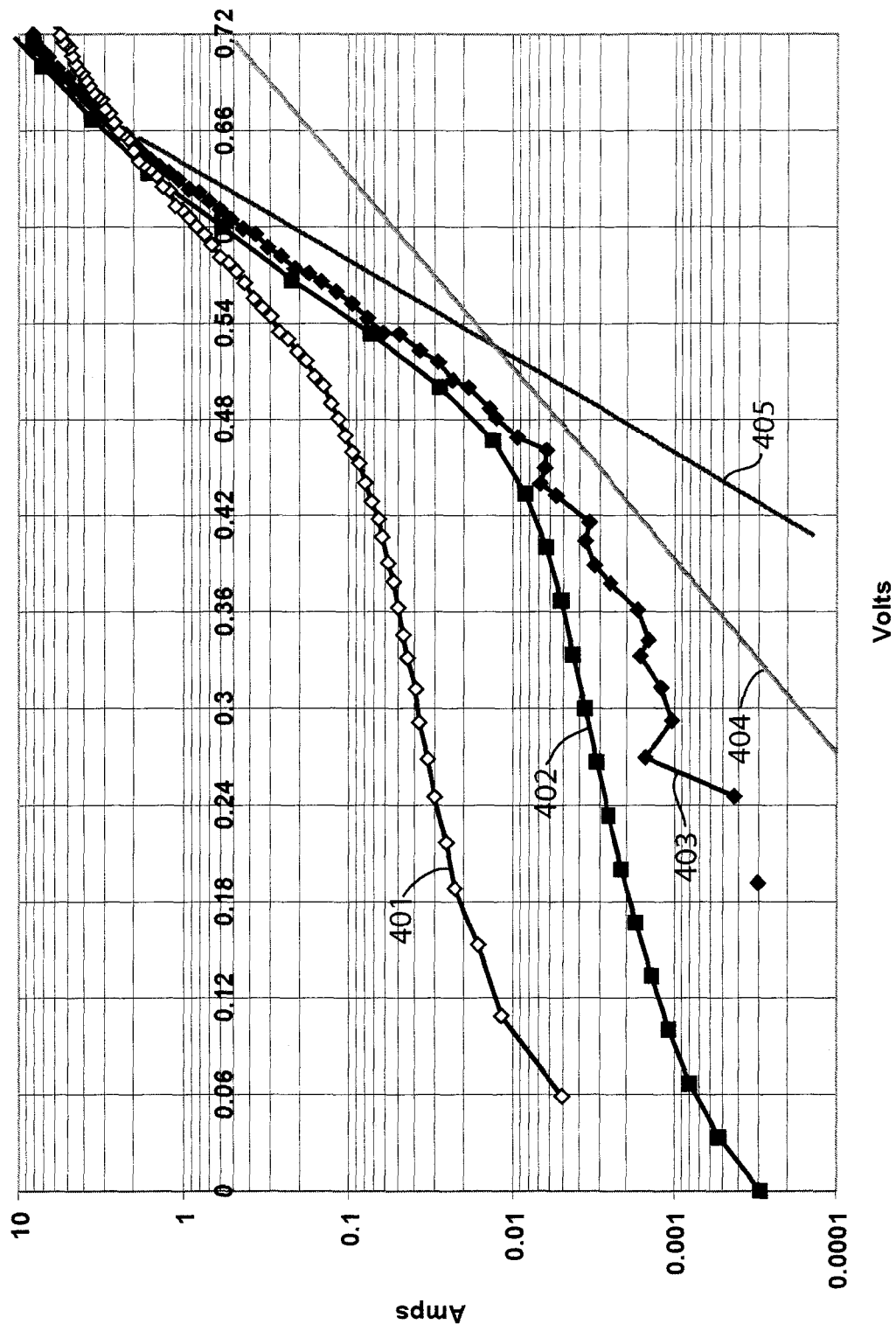
FIG. 11 shows dark I-V curves comparing the performance of a test structure solar cell to a solar cell that is in accordance with an embodiment of the present invention.

FIG. 11 shows dark I-V (i.e., current-voltage) curves comparing the performance of a conventional solar cell to a solar cell that is in accordance with an embodiment of the present invention. The I-V curves are "dark" in that they were measured with no direct solar radiation shining on the solar cells.

The I-V curves are for the diodes formed between an N-type silicon and a P-type doped region. In the example of FIG. 11, the horizontal axis represents voltage across the diode and the vertical axis represents the resulting current across the diode. Plot 401 is the I-V curve for a test structure solar cell with touching P-type and N-type polysilicon doped regions, plot 402 is the I-V curve for a typical Sunpower Corporation A300™ solar cell, and plot 403 is for a solar cell having a trench between the P-type and N-type doped regions as in FIGS. 1 and 9. While the plot 402 is very close to the ideal I-V curve represented by the plot 404, the plot 403 is even closer. The plot 405 represents a guide for the eye of an ideal diode I-V characteristic, the slope of which is 60 millivolts per decade of current.

Figure 12:
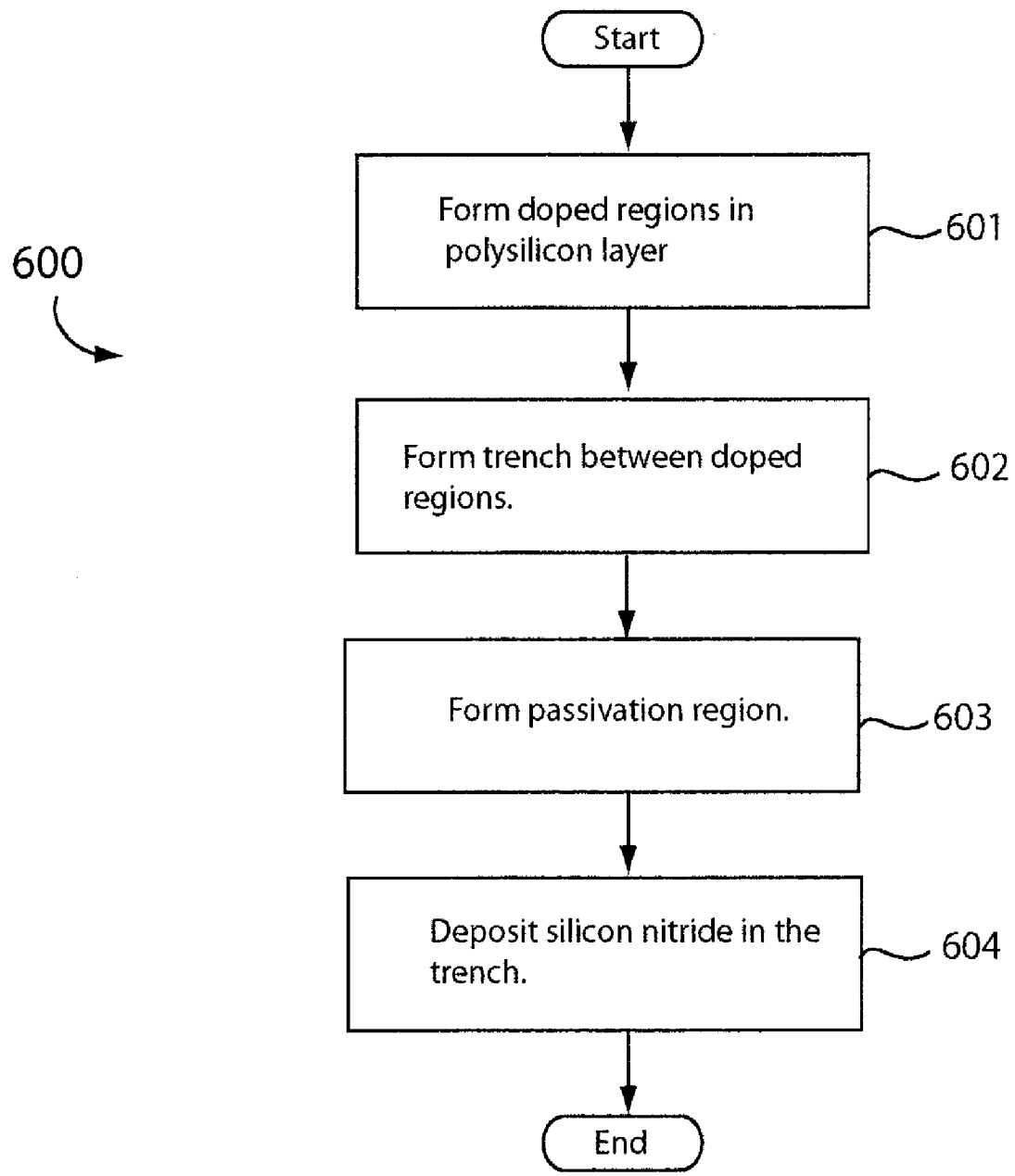
FIG. 12 shows a flow diagram of a method of fabricating a solar cell in accordance with an embodiment of the present invention.

Referring now to FIG. 12, there is shown a flow diagram of a method 600 of fabricating a solar cell in accordance with an embodiment of the present invention. In the method 600, doped regions are formed in a polysilicon layer (step 601). The doped regions may be formed by depositing doped silicon dioxide layers over an undoped polysilicon layer and performing a diffusion step, by depositing pre-doped silicon dioxide layers, or by depositing an undoped polysilicon layer followed by a dopant implantation step, for example. The polysilicon layer where the doped regions are formed may be etched to form a trench separating the P-type doped region from the N-type doped region (step 602). Alternatively, the trench is formed before the doped regions are formed. The trench may include a textured surface for increased solar radiation collection. A passivation region, such as passivation layer or a diffused region in the substrate, may be formed to isolate trench material from the bulk of the substrate (step 603). A dielectric in the form of a silicon nitride layer may then be deposited in the trench (step 604). Interdigitated metal contact fingers may thereafter be formed to electrically connect to the P-type and N-type doped regions through the silicon nitride.

As explained, physically separating the P-type and N-type doped regions helps increase the solar cell's efficiency by removing the butting junction where these doped regions touch. Although the butting junction has deleterious effect on the solar cell's efficiency due to resulting relatively high forward leakage current, the butting junction lowers the reverse breakdown voltage of the solar cell. The reverse breakdown voltage typically occurs when the solar cell is shaded (i.e., no solar radiation directly shining on the solar cell). The reverse breakdown voltage is from avalanche and zener breakdown mechanisms in the diode formed by the butting portions of the P-type and N-type doped regions. The reverse breakdown voltage of some solar cells with butting junctions is about −4 volts, for example. In comparison, because it has no butting junction, a solar cell with fully trenched P-type and N-type polysilicon doped regions have much higher reverse breakdown voltage, which may be as high as −100 volts. A high reverse breakdown voltage may result in excessive heat and potentially poses a safety issue.

Figure 13:
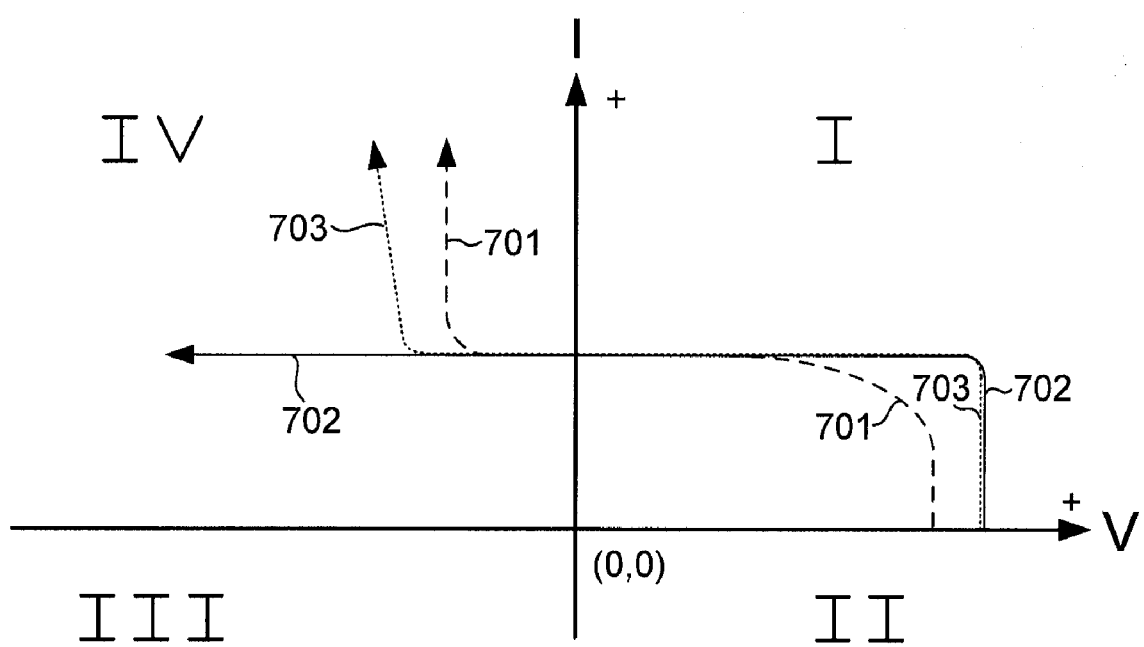
FIG. 13 shows I-V curves illustrating the behavior of various solar cells as discovered by the inventors.

FIG. 13 shows I-V curves illustrating the behavior of various solar cells as discovered by the inventors. In FIG. 13, the horizontal axis represents voltage and the vertical axis represents current. The first quadrant I to the right of the origin (0,0) represents positive voltage and current. The fourth IV quadrant to the left of the origin (0, 0) represents negative voltage and positive current.

I-V curve 701 is for a first sample solar cell without a trench separating the P-type and N-type doped regions. I-V curve 702 is for a second sample solar cell with a continuous trench separating the P-type and N-type doped regions, such as the solar cell shown in FIG. 2.

As the first sample solar cell is shaded, the curve 701 goes to the left as the voltage developed by the first sample solar cell becomes more negative. The butting junction diode eventually breaks down at a reverse breakdown voltage, such as −4 volts. The resulting increased in current is limited by other solar cells in the same module and is usually not a concern. While the reverse breakdown voltage of the first sample solar cell is relatively low, the cell's performance in the forward voltage region (i.e., when solar radiation is impinging on the solar cell; see the first quadrant I) is not competitive relative to that of the second sample solar cell. More specifically, I-V curve 702 of the second sample solar cell indicates that the second sample solar cell is more efficient than the first sample solar cell during normal operation, as can be seen by comparing I-V curves 701 and 702 in the first quadrant I.

The inventors discovered the unexpected result that by interrupting a trench separating the P-type and N-type doped regions at different portions of the trench such that the P-type and N-type doped regions touch in the interrupted portions, the reverse breakdown characteristics of a solar cell can be improved without substantially adversely affecting its forward voltage characteristics during normal operation.

In FIG. 13, the I-V curve 703 is for a third sample solar cell with interrupted trenches in accordance with an embodiment of the present invention. As the third sample solar cell is shaded, the curve 703 goes to the left as the voltage developed by the third sample solar cell becomes more negative. The third sample solar cell eventually breaks down at a reverse breakdown voltage of about −6 volts, which is a little larger compared to that of the second sample solar cell. However, the forward voltage characteristics of the third sample solar cell is comparable to that of the second sample solar cell, as can be seen by comparing I-V curves 703 and 702 in the first quadrant I. That is, the use of interrupted trenches allows for improved efficiency during normal operation when the sun is shining on the solar cell, while having a relatively low reverse breakdown voltage when the solar cell is shaded. A solar cell with interrupted trenches is now described beginning with FIG. 14.

Figure 14:
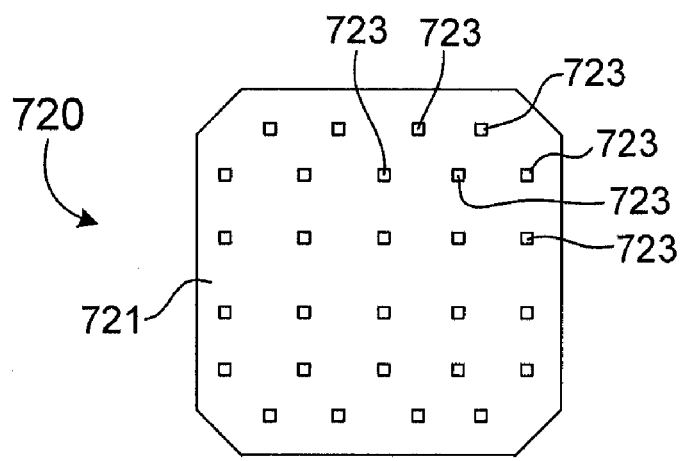
FIG. 14 schematically shows a solar cell in accordance with an embodiment of the present invention.

FIG. 14 schematically shows a solar cell 720 in accordance with an embodiment of the present invention. The solar cell 720 may comprise a backside contact solar cell having P-type and N-type doped regions in a polysilicon layer formed on the backside 721. The front side of the solar cell 720, which is opposite the backside 721, faces towards the sun during normal operation. In the example of FIG. 14, a plurality of trench interruptions 723 represents interruptions or breaks in interrupted trenches between P-type and N-type doped regions. Only some of the trench interruptions 723 have been labeled for clarity of illustration.

Figure 15:
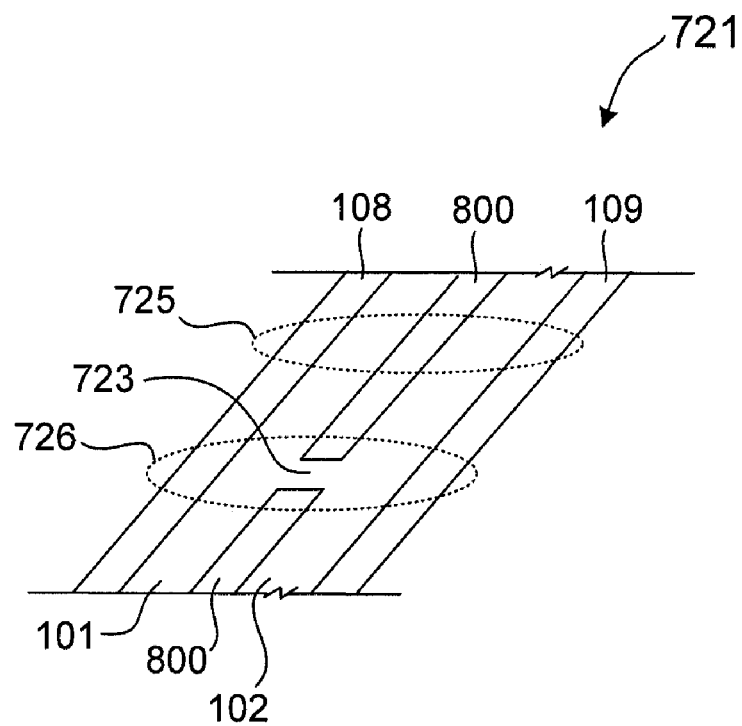
FIG. 15 schematically shows a magnified view of a portion of a backside of the solar cell of FIG. 14 in accordance with an embodiment of the present invention.
Figure 19:
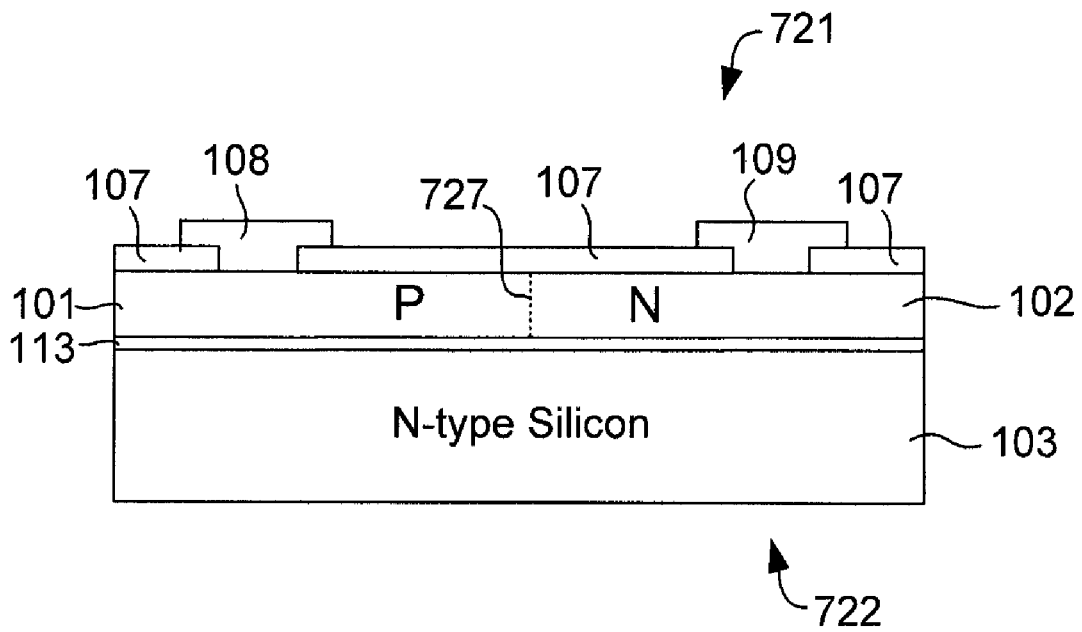
FIG. 19 shows a cross-section of the solar cell of FIG. 14 in accordance with an embodiment of the present invention.

FIG. 15 schematically shows a magnified view of a portion of the backside 721 in accordance with an embodiment of the present invention. In the example of FIG. 15, metal contact fingers 108 and 109 are interdigitated on the backside 721. An interrupted trench 800 separates a P-type doped region 101 and an N-type doped region 102 in most locations. Trench interruptions 723 (only one is shown in FIG. 15) breaks continuity of the trench 800 at certain locations, allowing the P-type doped region 101 and the N-type doped region 102 to physically touch or abut in those locations. Metal contact fingers 108 and 109 electrically couple to the P-type and N-type doped regions, respectively. In practice, as shown in FIGS. 17 and 19, the metal contact fingers 108 and 109 connect to their respective doped regions by way of a dielectric, which in one embodiment comprises a silicon nitride 107 (e.g., see FIGS. 17 and 19).

As will be more apparent below, the solar cell 720 is the same as the previously described solar cells having a trench (e.g., see FIGS. 2 and 10) except that the trench 800 of the solar cell 720 is interrupted to allow for improved efficiency with lower reverse breakdown voltage. Accordingly, the solar cell 720 may be fabricated using the same process as previously described for the solar cells of FIGS. 2 and 10 except that the trench 800 is not continuous as it is interrupted at certain locations. The trench interruptions may be formed by using a corresponding mask pattern or by appropriate control of a laser in the trench etch step. For example, a mask pattern for the trench etch may include trench interruptions where the trench is not dug. As another example, the laser digging the trench may be turned off in the trench interruptions.

Figure 16:
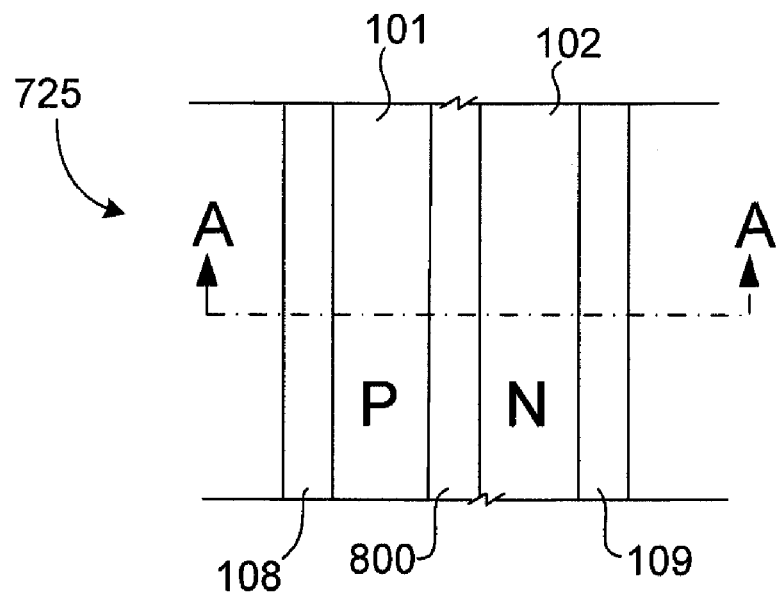
FIG. 16 schematically shows a plan view of an area shown in FIG. 15.

FIG. 16 schematically shows a plan view of an area of the backside 721 generally bounded by a dashed perimeter 725 in FIG. 15. FIG. 16 shows a continuous (i.e., not interrupted) portion of the trench 800. The trench 800 physically separates the P-type doped region 101 and the N-type doped region 102. FIG. 16 also shows the P-type metal contact finger 108 electrically coupled to the P-type doped region 101 and the N-type metal contact finger 109 electrically coupled to the N-type doped region 102.

Figure 17:
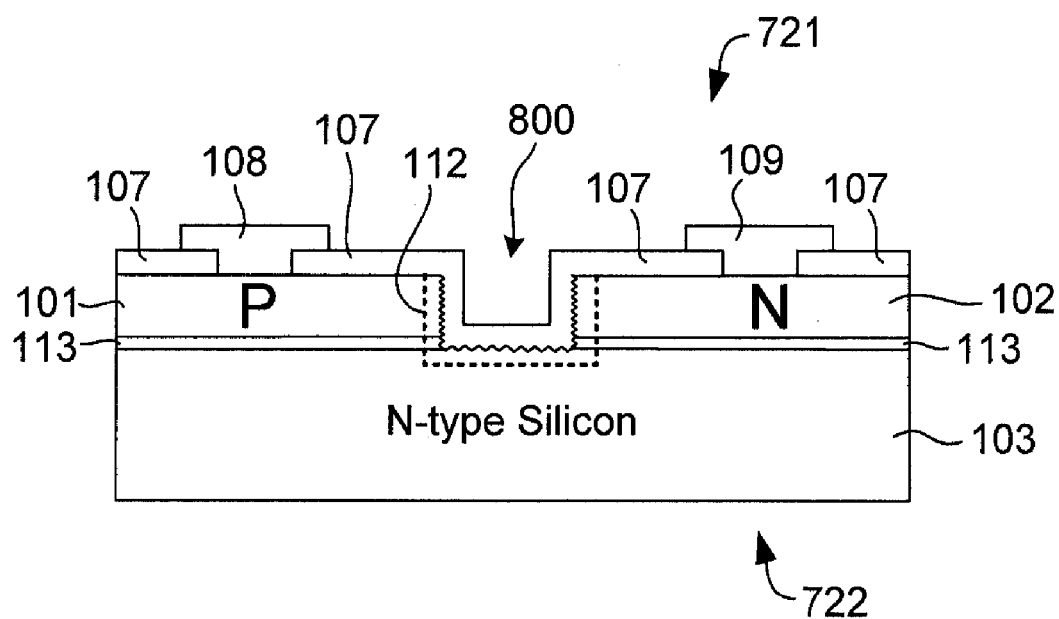
FIG. 17 shows a cross-section of the solar cell of FIG. 14 in accordance with an embodiment of the present invention.

FIG. 17 shows a cross-section taken at section A-A of FIG. 16 in accordance with an embodiment of the present invention. FIG. 17 shows the backside 721 and the front side 722 of the solar cell. It is to be noted that the cross-section of FIG. 17 is the same as that shown in FIG. 2 except for the trench 800. The trench 104 of FIG. 2 is continuous throughout whereas the trench 800 of FIG. 17 has interruptions. The other structures labeled in FIG. 17 have been previously explained with reference to FIG. 2.

Figure 18:
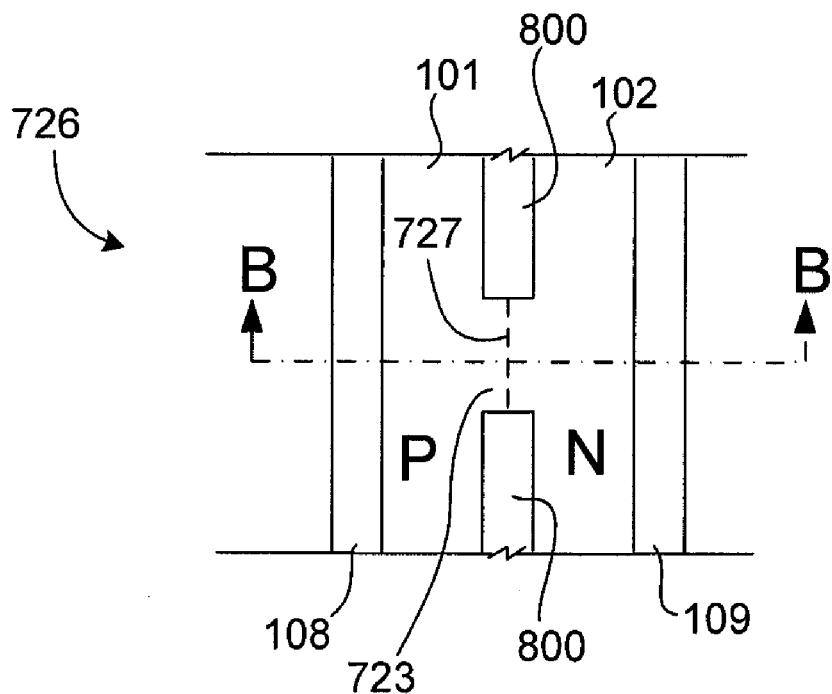
FIG. 18 schematically shows a plan view of another area shown in FIG. 17.

FIG. 18 schematically shows a plan view of an area of the backside 721 generally bounded by a dashed perimeter 726 in FIG. 15. FIG. 18 shows a trench interruption 723 where the P-type doped region 101 and the N-type doped region 102 touch. A dashed line 727 indicates the butting junction formed by the P-type doped region 101 and the N-type doped region 102. In practice, there are several trench interruptions 723 along the length of the trench 800. Only one trench interruption 723 is shown in FIG. 18 for clarity of illustration. FIG. 18 also shows the P-type metal contact finger 108 electrically coupled to the P-type doped region 101 and the N-type metal contact finger 109 electrically coupled to the N-type doped region 102.

FIG. 19 shows a cross-section taken at section B-B of FIG. 18. FIG. 19 shows the backside 721 and the front side 722 of the solar cell. It is to be noted that the cross-section of FIG. 19 is the same as that shown in FIG. 17 except without the trench 800 because the cross-section is taken at a trench interruption 723. Accordingly, the silicon nitride 107 extends from the metal contact finger 108 to the metal contact finger 109. Also, the P-type doped region 101 and the N-type doped region 102 form a butting junction 727. Generally speaking, the P-type doped region 101 and the N-type doped region 102 at the butting junction 727 form a diode with a reverse breakdown voltage that is relatively low. This advantageously allows the solar cell to have relatively low reverse breakdown voltage when shaded. Higher doping concentration and higher doping gradient of the polysilicon where the P-type doped region 101 and N-type doped region 102 are formed lower the reverse breakdown voltage. The lower reverse breakdown voltage allows the perimeter of the butting junction to be reduced by a factor of 100, which only increases the reverse breakdown voltage from −4 volts to −6 volts in one example. The other structures labeled in FIG. 19 have been previously explained with reference to FIG. 2.

Figure 20:
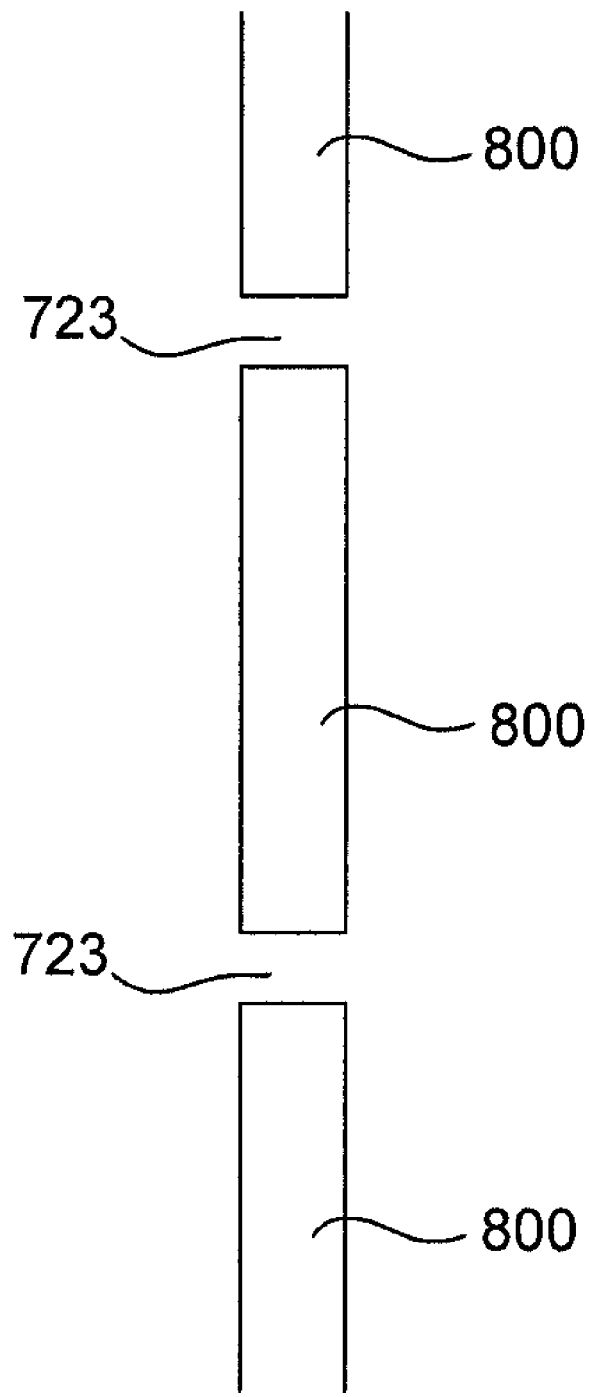
FIG. 20 schematically shows a plan view of an interrupted trench in accordance with an embodiment of the present invention.

FIG. 20 schematically shows a plan view of an interrupted trench 800 in accordance with an embodiment of the present invention. A plurality of trench interruptions 723 break continuity of the trench 800, allowing for formation of butting junctions between adjacent P-type and N-type doped regions in the interruptions. In one embodiment, the interruptions 723 constitute about 0.1% to 10% of the total length of the trench 800 if the trench 800 were continuous. The total length of the trench 800 may be approximately 125 mm, which is a dimension across the wafer.

Figure 21:
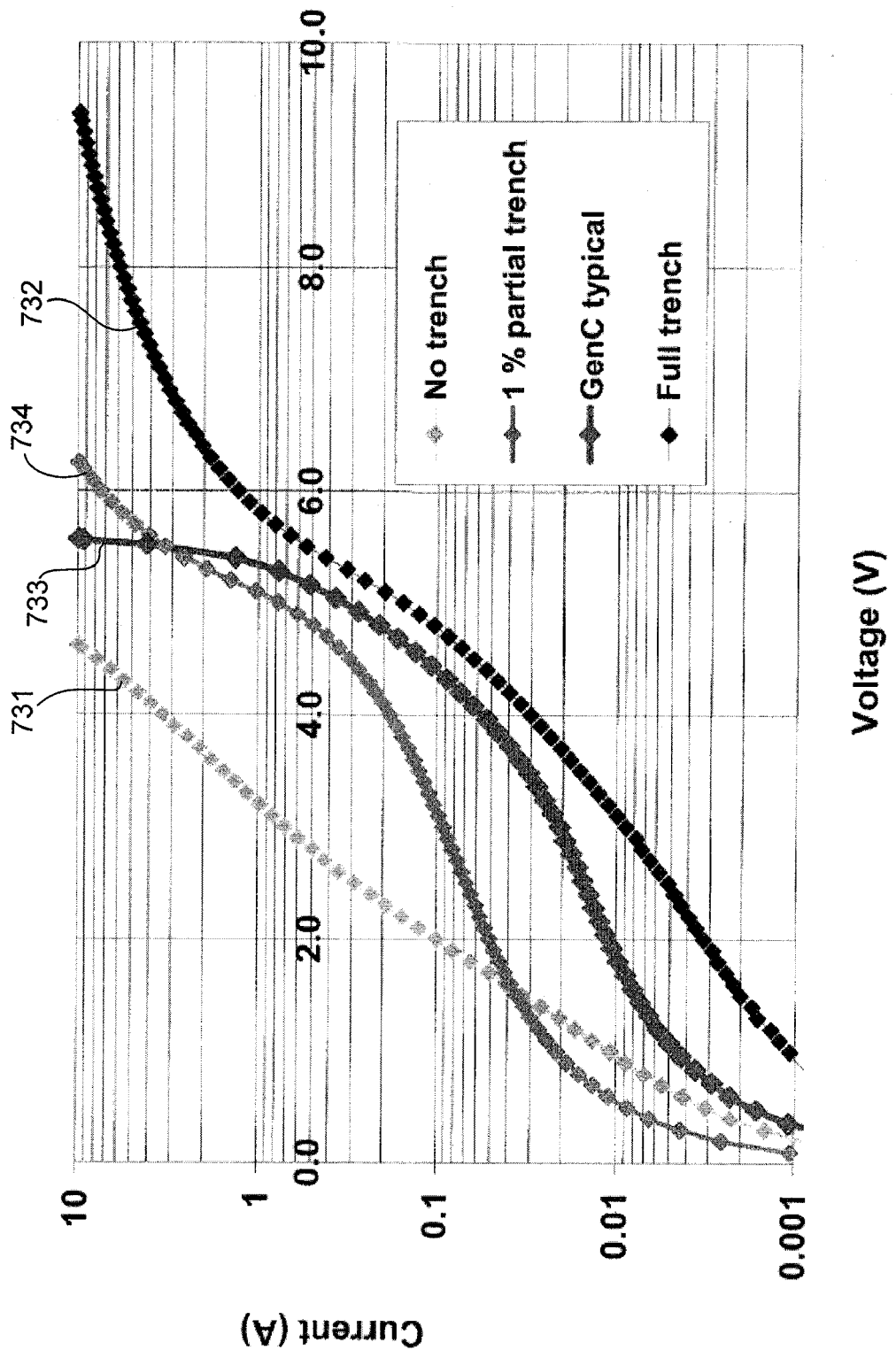
FIG. 21 shows I-V curves representing reverse breakdown characteristics of various solar cells in experiments performed by the inventors.

FIG. 21 shows I-V curves representing reverse breakdown characteristics of various solar cells in experiments performed by the inventors. In the example of FIG. 21, the horizontal axis represents reverse voltage and the vertical axis represents current. I-V curve 731 is for a test structure solar cell without trenches and accordingly has touching P-type and N-type polysilicon doped regions throughout, I-V curve 732 is for a solar cell with continuous trenches as in FIGS. 2 and 10, I-V curve 733 is for a typical Sunpower Corporation A300™ solar cell, and I-V curve 734 is for a solar cell having interrupted trenches. Note that the curve 731 of the solar cell with no trench is fairly steep, resulting in a lower reverse breakdown voltage compared to the curve 732 of the solar cell with full trenches. The curve 734 of the solar cell with interrupted trenches indicates a slightly higher reverse breakdown voltage compared to curves 731 and 733. However, as previously explained, the interrupted trenches allow for higher efficiency in the forward voltage region, which is during normal operation when the solar cell is fully exposed to the sun.

Figure 22:
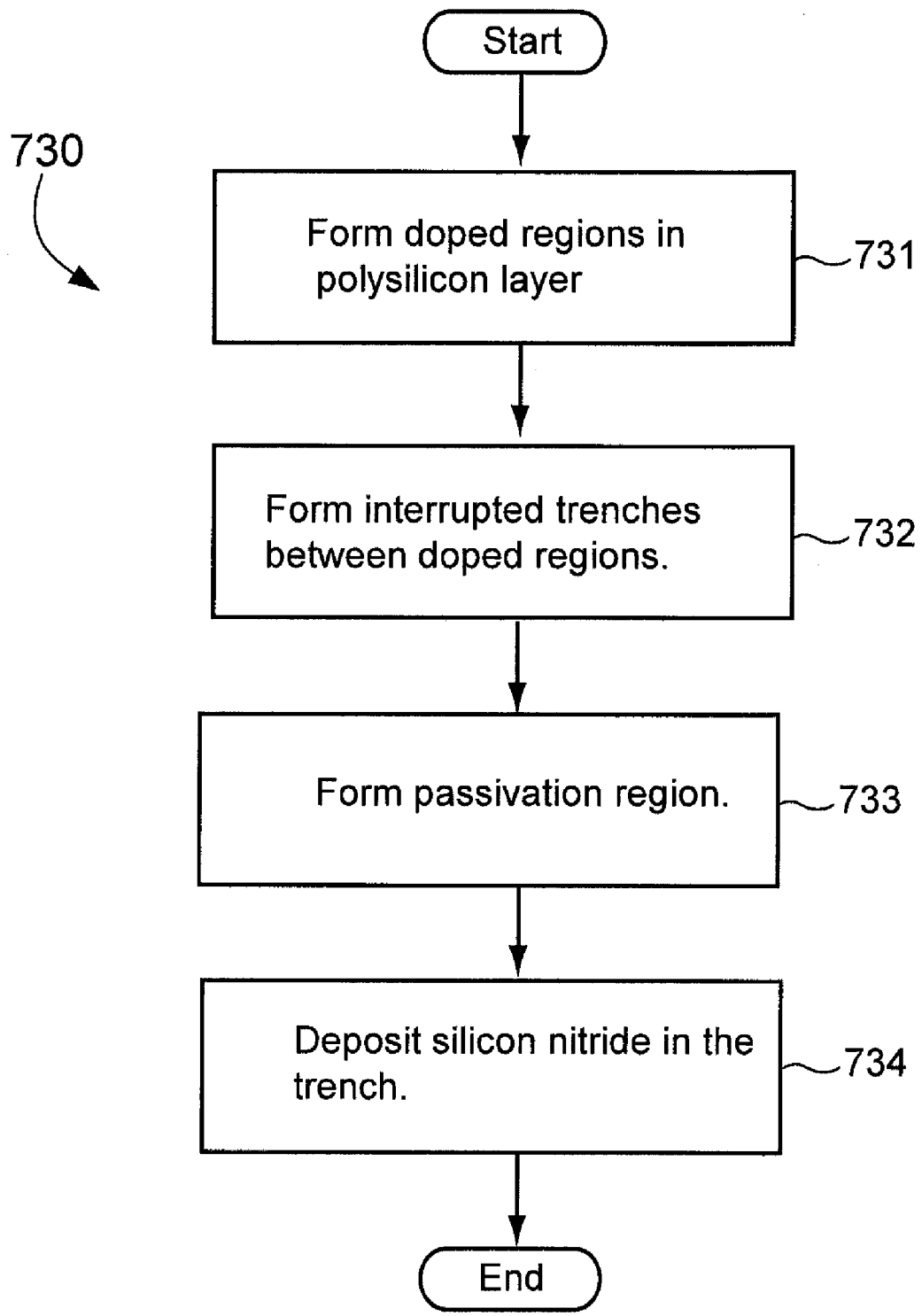
FIG. 22 shows a flow diagram of a method of fabricating a solar cell in accordance with an embodiment of the present invention.

FIG. 22 shows a flow diagram of a method 730 of fabricating a solar cell in accordance with an embodiment of the present invention. In the method 730, P-type and N-type doped regions are formed in a polysilicon layer (step 731). The doped regions may be formed by depositing doped silicon dioxide layers over an undoped polysilicon layer and performing a diffusion step, by depositing pre-doped silicon dioxide layers, or by depositing an undoped polysilicon layer followed by a dopant implantation step, for example. The polysilicon layer where the doped regions are formed may be etched to form an interrupted trench between the P-type doped region from the N-type doped region (step 732). The interrupted trench may separate the P-type and N-type doped regions at continuous portions (e.g., 99% of the total length) of the interrupted trench and allows the P-type and N-type doped regions to touch at interrupted portions (e.g., 1% of the total length) of the interrupted trench. The interrupted trench may also be formed before the doped regions are formed. The interrupted trench may include a textured surface for increased solar radiation collection. A passivation region, such as passivation layer or a diffused region in the substrate, may be formed to isolate trench material from the bulk of the substrate (step 733). A dielectric in the form of a silicon nitride layer may then be deposited in the interrupted trench (step 734). Interdigitated metal contact fingers may thereafter be formed to electrically connect to the P-type and N-type doped regions through the silicon nitride.

Depending on design and environmental particulars, having several trench interruptions 723 along the trench 800 may lead to thermal runaway and overheat the solar cell. To prevent thermal runaway, the number and placement of trench interruptions 723 on a trench 800 may be limited. These embodiments are now explained beginning with FIG. 23.

Figure 23:
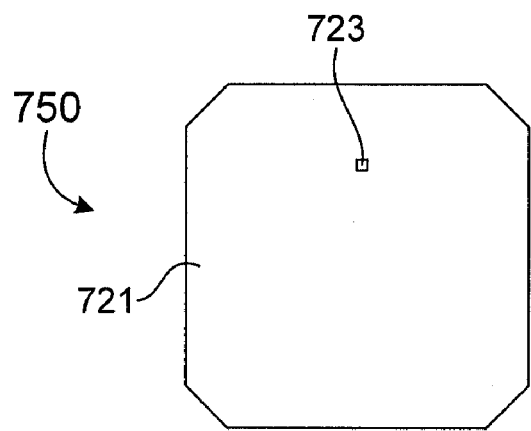
FIG. 23 schematically shows a solar cell with a single trench interruption in accordance with an embodiment of the present invention.

FIG. 23 schematically shows a solar cell 750 in accordance with an embodiment of the present invention. The solar cell 750 is the same as the solar cell 720 (see FIG. 14) except that the solar cell 750 has only one trench interruption 723 on the entire backside 721. That is, there is no other trench interruption 723 on any trench of the solar cell 750.

Figure 24:
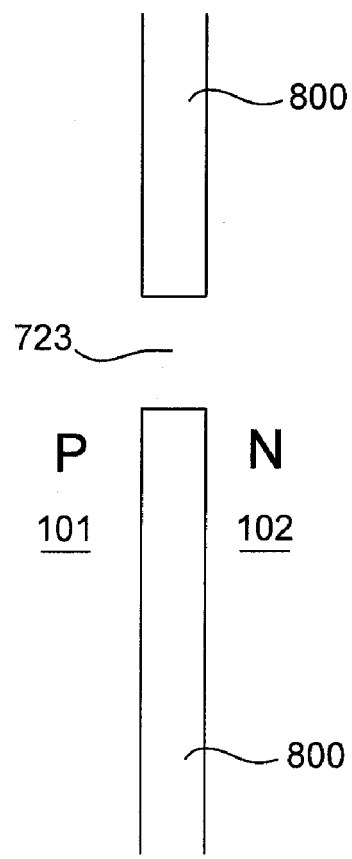
FIG. 24 schematically shows a plan view of an interrupted trench in the solar cell of FIG. 23.

FIG. 24 schematically shows a plan view of an interrupted trench 800 in the solar cell 750. As before, the trench 800 physically separates the P-type doped region 101 and N-type doped region 102. The single trench interruption 723 breaks continuity of the trench 800, allowing for formation of a butting junction between the P-type doped region 101 and the N-type doped region 102 in a single location in the solar cell 750. Generally speaking, there may be one to ten trench interruptions, with a single trench interruption for the entire wafer being preferable.

Figure 25:
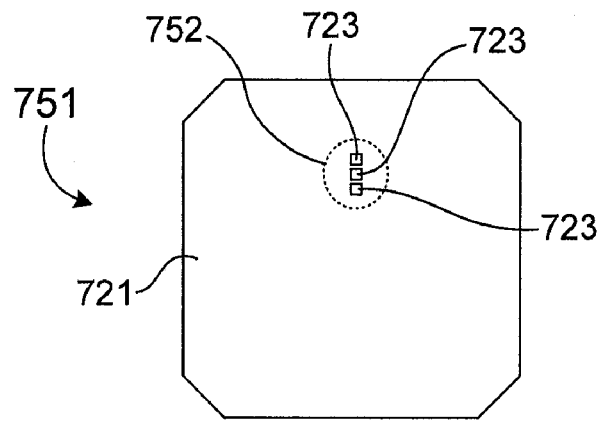
FIG. 25 schematically shows a solar cell with multiple trench interruptions in a single region having substantially the same local operating temperature in accordance with an embodiment of the present invention.

FIG. 25 schematically shows a solar cell 751 in accordance with an embodiment of the present invention. The solar cell 751 is the same as the solar cell 720 (see FIG. 14) except that the solar cell 751 has several trench interruptions 723 (three in the example of FIG. 25) concentrated on only one continuous region 752. That is, there is no other region 752 (hence no other trench interruptions 723) in the solar cell 751. The entire area of the single region 752 has substantially the same or common local operating temperature.

Figure 26:
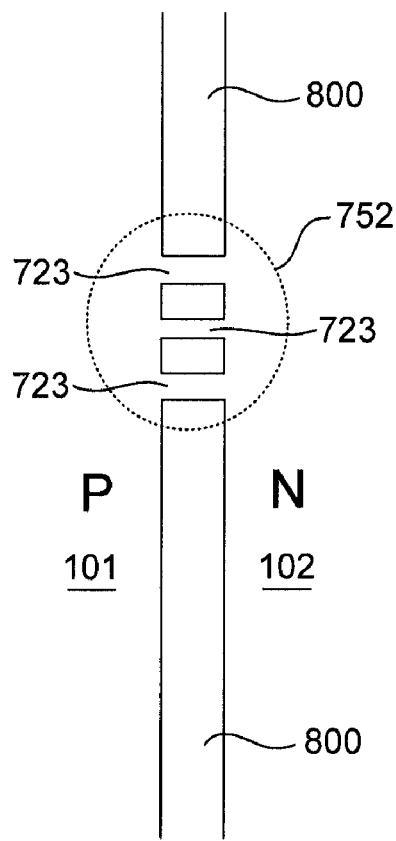
FIG. 26 schematically shows a plan view of an interrupted trench in the solar cell of FIG. 25.

FIG. 26 schematically shows a plan view of an interrupted trench 800 in the solar cell 751. As before, the trench 800 physically separates the P-type doped region 101 and the N-type doped region 102. The trench interruptions 723 in the single region 752 break continuity of the trench 800, allowing for formation of butting junctions between the P-type doped region 101 and the N-type doped region 102 in the single region 752.

As can be appreciated from the foregoing, solar cells in accordance with embodiments of the present invention may have trench interruptions 723 spaced throughout the length of a trench 800, only one trench interruption 723, a plurality of trench interruptions 723 on only one continuous region, and other design combinations (e.g., two local regions, each of which has several spaced trench interruptions 723; two trench interruptions 723 in separate regions with substantially different local operating temperatures) without detracting from the merits of the present invention.

Improved solar cell fabrication processes and structures have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell structure comprising:
   a doped silicon substrate having a front side configured to face the sun during normal operation and a backside opposite the front side;
   a P-type doped region and an N-type doped region comprising polysilicon, wherein the P-type doped region and the N-type doped region are physically separate in one location and touch each other forming a butting junction in another location;
   a first dielectric layer between the substrate and the P-type doped region and the N-type doped region; and
   a second dielectric layer formed over the P-type doped region and the N-type doped region.

2. The solar cell structure of claim 1 wherein the first dielectric layer comprises silicon dioxide formed to a thickness between 5 to 40 Angstroms on a surface of the silicon substrate.

3. The solar cell structure of claim 1 wherein the P-type doped region and the N-type doped region are physically separated by an interrupted trench structure.

4. The solar cell structure of claim 1 further comprising:
   a passivation layer between the second dielectric layer and the substrate.

5. The solar cell structure of claim 3 further comprising a diffused passivation region in the substrate under the interrupted trench structure, wherein the passivation region is doped with an N-type dopant.

6. The solar cell structure of claim 1 further comprising interdigitated metal contact fingers electrically coupled to the P-type and N-type doped regions through the second dielectric layer.

7. A solar cell comprising:
   a P-type doped region and an N-type doped region formed on a backside of a doped silicon substrate, the P-type doped region and the N-type doped region comprising polysilicon, each of the P-type and N-type doped regions being formed over a dielectric layer that is formed between the silicon substrate and the P-type and N-type doped regions; and
   an interrupted trench structure separating the P-type doped region and the N-type doped region and dividing the dielectric layer, the interrupted trench structure allowing the P-type doped region and the N-type doped region to touch in a first location.

8. The solar cell of claim 7 wherein the silicon substrate comprises an N-type silicon substrate.

9. The solar cell of claim 7 further comprising a second location where the P-type doped region and the N-type doped region touch.

10. The solar cell of claim 9 wherein the first and second locations are in a same region having substantially same local operating temperature.

11. The solar cell of claim 7 wherein the first location is the only location in the solar cell where the P-type doped region and the N-type doped region touch.

12. The solar cell of claim 7 further comprising a passivation layer formed on a surface of the interrupted trench structure.

* * * * *